(12) United States Patent
Johnson et al.

(10) Patent No.: US 6,297,987 B1
(45) Date of Patent: Oct. 2, 2001

(54) MAGNETORESISTIVE SPIN-INJECTION DIODE

(75) Inventors: Mark B. Johnson, Springfield; Brian Bennett, Arlington, both of VA (US); Philip R Hammar, Baltimore, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/408,526

(22) Filed: Sep. 30, 1999

(51) Int. Cl.$^7$ .................................................. G11C 11/00
(52) U.S. Cl. .......................... 365/158; 365/171; 365/175
(58) Field of Search .................................... 365/158, 171, 365/175

(56) References Cited

U.S. PATENT DOCUMENTS

| | | | |
|---|---|---|---|
| 4,831,427 | * 5/1989 | Coleman, Jr. ......................... | 365/171 |
| 5,652,445 | 7/1997 | Johnson ................................ | 257/295 |
| 5,654,566 | 8/1997 | Johnson ................................ | 257/295 |
| 6,141,191 | * 10/2000 | Lee et al. ............................ | 360/324.1 |

OTHER PUBLICATIONS

"Hybrid Hall Effect Device" by Mark Johnson, B. Bennett, M.J. Yang, M.M. Miller and B.V. Shanabrook, Appl. Phys. Lett. 71, (7)974–76 (1997).
"Theory of spin–dependent transport in ferromagnet—semiconductor heterostructures," by Mark Johnson, Phys. Rev. B 58, 9635 (1998).
"Observation of Spin Injection at a Ferromagnet–Semiconductor Interface" by P.R. Hammar, B. R. Bennett, M.J. Yang, and Mark Johnson, Phys. Rev. Lett. 83, 203 (1999).

* cited by examiner

Primary Examiner—Huan Hoang
(74) Attorney, Agent, or Firm—John J. Karasek; L. George Legg (57) ABSTRACT

A spin injected diode suitable for nonvolatile memory applications is made of a semiconducting channel capable of carrying current, a single ferromagnetic layer, and a barrier layer between the semiconducting channel and the ferromagnetic layer to protect the integrity of the semiconducting layer and to inhibit interdiffusion of the ferromagnetic material and the semiconductor. During diode readout the output modulation of the diode can be sensed either as the interface resistance between the semiconducting channel and the ferromagnetic layer, or as the output voltage between the semiconducting channel and the ferromagnetic layer when flowing current through the channel and not through the interface. Two of these spin injected diodes can be combined to form a spin injected field effect transistor. This transistor has a first ferromagnetic layer having a first coercivity and a second ferromagnetic layer having a second coercivity smaller than the first coercivity which are spaced apart. A gate is situated between the ferromagnetic layers and includes an insulating layer situated below the gate and between the two ferromagnetic layers. A semiconducting channel layer beneath the first and second ferromagnetic layers and beneath the gate forms a low impedance electrical path between the first and second ferromagnetic layers when a control signal is applied to the gate and a high impedance electrical path between these ferromagnetic layers at all other times. A key component is a barrier layer between the semiconducting channel and the two ferromagnetic layers which performs the same functions as in the diode.

30 Claims, 3 Drawing Sheets

MAGNETORESISTIVE SPIN-INJECTION DIODE

BACKGROUND OF THE INVENTION

1. Field of the Invention

This invention relates to a spin injected diode and a spin injected field effect transistor which is made from two spin injected diodes.

2. Description of the Related Art

There are many kinds of devices that are used as nonvolatile storage cells, but all of them have weaknesses. Traditional technologies (older than ten years) include floating gate field effect transistors and ferroelectric capacitors. Floating gate technologies have slow write ($10^{-5}$ to $10^{-4}$ sec) and erase ($10^{-4}$ to $10^{-2}$ sec) times, and have limited write endurance (typically $10^5$ cycles). Ferroelectric approaches typically use destructive readout, have limited endurance and require a large voltage (5 V or more). Most ferroelectric cells require large areas and some designs suffer from limited retention. The read and write times are limited to the order of a few hundred nsec.

In the past few years, new approaches have been invented using magnetoelectronic technologies, i.e. electronic devices that incorporate one or more ferromagnetic (F) elements. One such category is all-metal magnetoresistive devices, sometimes called giant magnetoresistive (GMR) structures, which typically are trilayers with two F films and a nonmagnetic film N sandwiched in between. These are low impedance devices with two resistive states, R and R+δR, separated by $δR/R \approx 6$ to 8%. To achieve voltage readout levels of order 1 to 10 mV, large currents must be driven through the patterned, multilayer wires. The readout times are relatively long, the readout power is relatively high, and electromigration that degrades the F-N interface is a limiting wearout mechanism. The layer thicknesses are typically a few nm, and must be controlled to the level of a few Å. Since the two F films are exchange coupled through the N layer, reproducibility of device switching is problematic. Finally, device isolation, from others in an array, is poor and viable cell designs require an isolation transistor. Alternatively, a number of devices can be fabricated on a line with isolation transistors at each end of the line. However, the signal to noise ratio is diminished, read times are lengthened, and read power is increased.

Magnetic tunnel junctions (MTJ) form another popular device category. These are high impedance devices, with two F films separated by a thin dielectric barrier. The two resistive states, R and R+δR, are separated by $δR/R \approx 25$ to 30% at low bias. The separation δR/R decreases for larger bias, and is approximately 15% at bias voltages of 300 mV, giving readout voltages of about 40 mV. The chief advantage of MTJ devices over GMR structures is that MTJs can achieve conveniently large readout voltages. Typical impedances for devices of relevant dimensions are the order of 0.01 to 1 MΩ. The readout voltages have high Johnson noise, and readout can be slowed by long RC times. Device isolation is poor, and typical memory designs involve the use of a transistor. The resulting cell design requires a relatively large area. A greater problem is scalability. MTJs can be made with device impedance margins of about ±10% for a minimum feature size of f=1 to 2 μm. To achieve reasonable impedance at smaller dimensions, a dielectric barrier with thickness of about 8 Å is required. Device yield and uniformity with such thin dielectric layers is extremely poor. Because of this, and because of the problem of device isolation, it is unlikely that MTJs will be viable for high density nonvolatile memory arrays.

Another category of magnetoelectronic memory device involves hybrid structures of ferromagnetic metal and semiconductor components. One such device is the spin injected FET (SI FET), a field effect transistor (FET) with ferromagnetic source and drain described in U.S. Pat. No. 5,654,566 to Mark Johnson titled Magnetic Spin Injected Field Effect Transistor and Method of Operation. The source-drain conductance has two values for each of the two configurations corresponding to parallel and antiparallel orientation of the magnetizations of source and drain.

A second device is the "Hybrid Hall Effect Device" (HHE) as described in "Hybrid Hall Effect Device" by Mark Johnson, B. Bennett, M. J. Yang, M. M. Miller and B. V. Shanabrook, Appl. Phys. Lett. 71, (1997) and in U.S. Pat. No. 5,652,445 to Mark Johnson. This is a bilayer structure with an electrically isolated ferromagnetic film fabricated with one edge over the center of a Hall cross. The ferromagnetic element does not support any current transport. Rather, it acts as the source of a dipolar magnetic field that has a large perpendicular component $B_z$, in the vicinity of the Hall cross. The local field $B_z$, develops a Hall voltage $V_H$ in the semiconductor channel, and the sign of $B_z$. and $V_H$ change when the in-plane magnetization of the ferromagnetic element is reversed. The write process uses current pulses applied through contiguous write wires, as described below, and the read process involves sensing $V_H$, in the transverse arms of the Hall cross when a read bias pulse is applied to the longitudinal arms. The HHE has the advantage of relatively large readout voltages and a device impedance that can be tuned to a desirable value, e.g. in the range 1 to 100 kΩ and more preferable from 100 Ω to 10 kΩ. Furthermore, the cell involves a single thin film ferromagnetic element, which is insensitive to thickness changes on the order of 1 nm. The margins of reproducibility for switching fields, for device output, and for device impedance are narrow and yields are high. The HHE also shows inverse scalability with the device output increases as device dimensions shrink. A memory cell requires the addition of a (Schottky) diode to isolate the HHE device from other devices in an array.

3. Objects of the Invention

It is an object of this invention to provide a magnetoelectronic device appropriate for digital applications where the magnetic characteristic is not relatively difficult to engineer reproducibly.

It is a further object of this invention to provide a magnetoelectronic device appropriate for digital applications where the output of the device is proportional to the device impedance, and a required output level can be attained by tuning the device impedance.

It is a further object of this invention to provide a magnetoelectronic device appropriate for digital applications where the device can also be operated with the diode output voltage referenced to the interface resistance between the ferromagnetic layer and the semiconductor layer It is a further object of this invention to provide a magnetoelectronic device appropriate for digital applications where the device can also be operated by flowing current through the channel and not through the interface and referencing the output voltage directly to the channel.

It is a further object of this invention to provide a magnetoelectronic device appropriate for digital applications where the device is fabricated with a single ferromagnetic film so that the magnetic properties of the single layer are more easily controlled.

It is a further object of this invention to provide a magnetoelectronic device appropriate for digital applications where the device has an intrinsic impedance that can be tuned within a range of convenient values.

It is a further object of this invention to provide a magnetoelectronic device appropriate for digital applications where the device has an impedance on the order of 1 KΩ to 100 KΩ.

It is a further object of this invention to provide a magnetoelectronic device appropriate for digital applications where the single device made of suitable materials performs a storage function and an isolation function.

It is a further object of this invention to provide a magnetoelectronic device appropriate for digital applications wherein two diodes can be fabricated over a common, gated channel to form a spin injected FET.

These and further objects of the invention will become apparent as the description of the invention proceeds.

SUMMARY OF THE INVENTION

A spin injected diode suitable for nonvolatile memory applications is made of a semiconducting channel capable of carrying current, a single ferromagnetic layer, and a barrier layer between the semiconducting channel and the ferromagnetic layer to protect the integrity of the semiconducting layer and to inhibit interdiffusion of the ferromagnetic material and the semiconductor. During diode readout the output modulation of the diode can be sensed either as the interface resistance between the semiconducting channel and the ferromagnetic layer, or as the output voltage between the semiconducting channel and the ferromagnetic layer when flowing current through the channel and not through the interface.

Two of these spin injected diodes can be combined to form a spin injected field effect transistor. The result is a magnetic spin injected transistor device made of a first ferromagnetic layer having a first coercivity and a second ferromagnetic layer having a second coercivity smaller than the first coercivity, and spaced apart from said first ferromagnetic layer. A gate is situated between the first and second ferromagnetic layers and includes an insulating layer situated below the gate and between the two ferromagnetic layers. A semiconducting channel layer beneath the first and second ferromagnetic layers and beneath the gate forms a low impedance electrical path between the first and second ferromagnetic layers when a control signal is applied to the gate and a high impedance electrical path between these ferromagnetic layers at all other times, and a barrier layer between the semiconducting channel and the first and second ferromagnetic layers protects the integrity of the semiconducting layer and inhibits interdiffusion of the ferromagnetic metal and the semiconductor.

Figure 1:
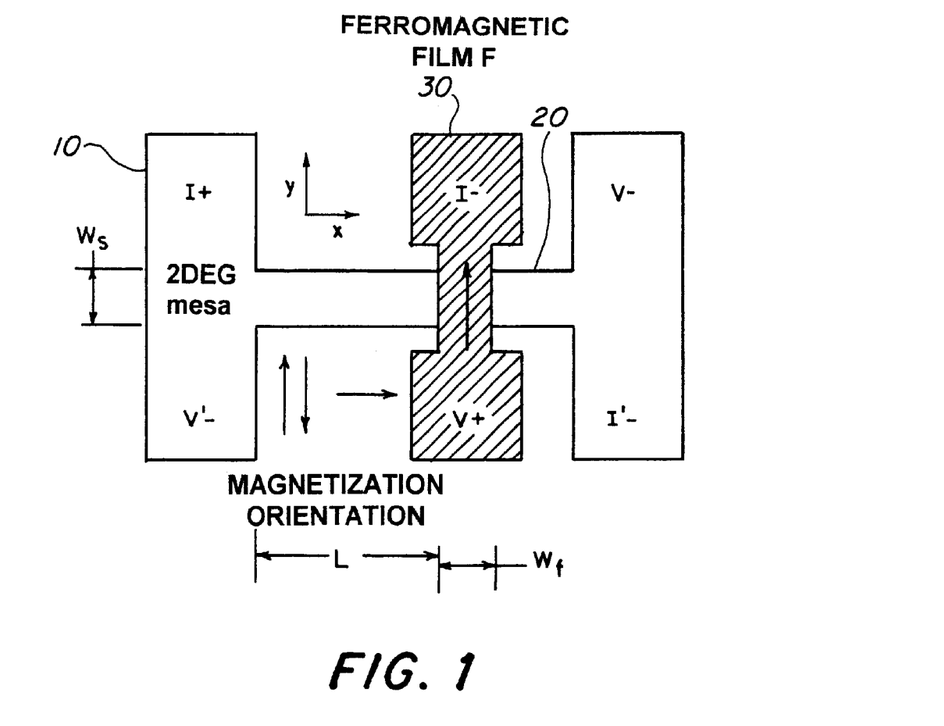
FIG. 1 illustrates a diode device according to the invention.

The Spin Injected Diode (SID) is a simple bilayer magnetoelectronic device. The physical principles of operation are described in the publication "Theory of spin-dependent transport in ferromagnet-semiconductor heterostructures," by Mark Johnson, Phys. Rev. B 58, 9635 (1998), and are briefly described as follows. A Schoftky diode is formed when a thin film metal wire makes electrical contact with a semiconductor channel (the Top View of FIG. 1 shows a typical cross geometry). The interface may be a direct, metal to semiconductor contact, or there may be a tunnel barrier [metal-insulator-semiconductor (MIS)].

In particular, the semiconducting channel may be a high mobility two dimensional electron gas (2DEG) confined in a III-V heterostructure. In some such structures, gradients of the confining potential (arising from asymmetries of the heterostructure), or internal electric fields intrinsic to the polar nature of the host material, result in substantial electric fields $E_z$, perpendicular to the plane of the 2DEG. The field $E_z$. causes a spin splitting of those carriers in the 2DEG that have momentum along the $\hat{x}$ axis. When the overlaid metal wire is composed of a thin ferromagnetic film F, the spin splitting of the carriers near the Fermi surface of F can couple with the spin split carriers of the 2DEG, resulting in spin dependent current rectification.

The magnetization $\vec{M}$ of F can be reversibly changed by the application of an external field $H_y$ to be oriented along $\pm\hat{y}$ and the diode characteristic of the SID therefore varies as a function of $H_y$. Equivalently, for a given magnetization orientation $\pm M\hat{y}$ the I-V characteristic of the diode differs for positive or negative polarity current I.

The intrinsic remanence of the magnetization of F provides a natural memory function, and the device can be used as a nonvolatile storage cell with binary states corresponding to the two stable magnetization states, $\pm M\hat{y}$. For memory applications, integrated devices would be fabricated in an array. Read and write operations would use an array of bit lines, word lines and write wires. In a write process, a current pulse in a contiguous write wire can be used to control the magnetization orientation of F and thereby control the binary state of the device. Readout of the stored bit is achieved by biasing the diode with a small current (or voltage) and sensing a relatively high or low voltage (or current). The diode characteristic provides an intrinsic isolation function, isolating any one cell from others in the array, and a storage cell can be composed of a single element, the SID. This characteristic promotes the achievement of high packing densities.

The device operations for using the diode according to the invention include using a single diode operation by sensing the output modulation of the diode interface resistance as a reference or by using the semiconducting channel as a reference. In addition two spin injected diodes can be fabricated on a common channel to make a SI FET.

DESCRIPTION OF THE PREFERRED EMBODIMENTS

The spin injected diode is also in the category of hybrid ferromagnet-semiconductor structures. When described as a device, the "spin injected diode" is a diode with a current-voltage (I-V) characteristic that varies according to the magnetization orientation of ferromagnetic component. Since the diode characteristic is non-Ohmic, it is not strictly correct to describe the I-V characteristic as "magnetoresistive." Nevertheless, for a conveniently chosen bias (current or voltage), the output (voltage or current) varies according to the remanent magnetization orientation off. In principle, the difference can be as large as the order often percent. Since the diode impedance can be tuned, having values in the range of 0.1 to 100 kΩ, convenient output levels of order tens of mV can be achieved. The device is intrinsically a bistable switch for digital applications, in particular for nonvolatile storage, and has the advantage that it can combine the functions of device isolation and nonvolatile storage in a single device structure made of suitable material. It may also have analog capabilities and, finally, two SIDs fabricated on a common channel and with a gate electrode can be used to form a spin injected FET. Some aspects of such a SI FET are superior to those discussed in the prior art.

Figure 2:
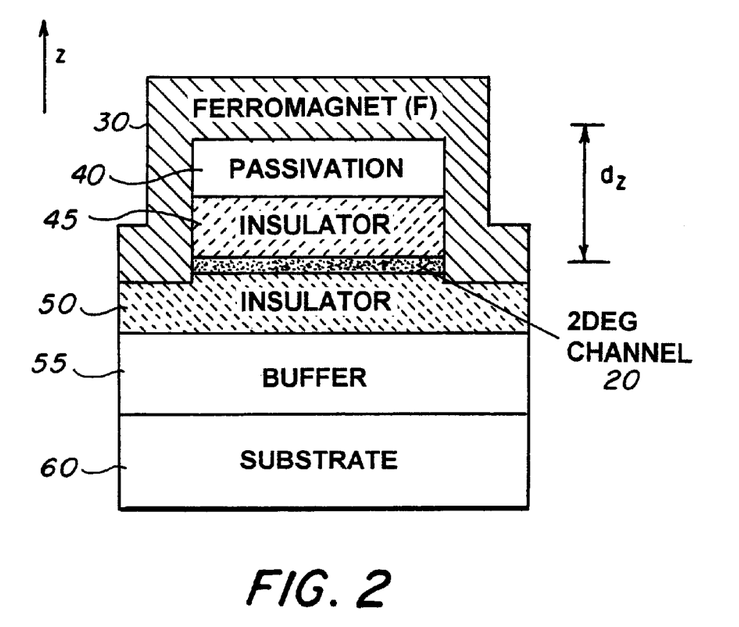
FIG. 2 illustrates a cross-sectional view of FIG. 1.

The diode device structure is depicted in FIGS. 1 and 2. In FIG. 1 the schematic drawing shows a mesa structure 10 which defines a two dimensional electron gas (2DEG) layer with a channel 20 connecting the two sides. Crossing over this channel is the ferromagnetic film in the form of a layer 30. The term "layer" as used herein means either a conventional flat layer or a structure with can be microfabricated or nonofabricated. The layer can also include bilayer magnetic films or composites. Not shown as a separate layer in this top view of FIG. 1 is the barrier layer between these two layers. There are four probes connected to the device in the embodiment measuring the interface resistance. The I+probe is the source of current applied to the mesa. The current flows through the 2DEG mesa and through the channel 20 and out the ferromagnetic film 30 at I−. To measure the output of the device the voltage is detected between the V+probe on the ferromagnetic film and the V−probe on the 2DEG mesa. This voltage measures the interface resistance between these two layers and conveniently drops out all of the other resistances in the device. The ferromagnetic material has one easy axis of magnetization, and two magnetization states. The device has two distinct output levels associated with those two states.

In the cross-sectional view of the channel structure in FIG. 2, a high mobility two dimensional electron gas (2DEG) is confined by a heterostructure to a channel layer some distance $d_z$ below the wafer surface. A mesa isolation etch defines the channel to have transverse width $w_s$ (refer to FIG. 1), typically on the order 1 $\mu$m or less. A ferromagnetic metal film F 30 is fabricated as a cross-strip (FIG. 1), also with typical transverse dimension $w_f$ of order 1 $\mu$m or less. The edges of the 2DEG channel at the side wall of the mesa should not be in Ohmic contact with F layer 30. This may be achieved by undercutting the heterostructure with an etch, or by creating an insulating region at the edges using charge depletion. The resulting structure is a Schottky diode, with electron (and/or hole) transport between the 2DEG layer 20 and the F layer 30. It is important to note that this structure maintains the integrity of the 2DEG in the vicinity of the diode.

Structures in which portions of the heterostructure are etched away may damage the 2DEG layer and the spin injection effect may be reduced or destroyed. In particular, etching the top portion of the heterostructure so that the F film makes Ohmic contact with the channel destroys the 2DEG in the vicinity of the junction. As a result, the channel material near the F film is irreversibly changed to a region of semiconductor with low mobility and injection into that material undesirably randomizes the spins.

The term "Ohmic contact" needs to be further clarified since the term can have a couple of meanings. One meaning is to a linear I-V characteristic at a metal-semiconductor contact, typically with low resistance. The other meaning refers to specific procedures that the artisans in this field use to achieve the first meaning of the term at an interface. These procedures typically involve annealing a metal layer so that it interdiffuses with the semiconductor. The result is "a dirty metal alloy" with a resistivity that is high for a metal, but low for a semiconductor. Given these two meanings, the point to clarify here is that it may be acceptable to have an "Ohmic contact" in the first sense of the term if it is only in a small region such as a pinhole. However, if the interface has been prepared as described in the second meaning then there will be so much scattering in the dirty alloy region that the spin orientation will be lost. Thus, statements that the 2DEG channel should not be in Ohmic contact with the ferromagnetic layer are in view of the second meaning. The barrier protects the integrity of the semiconducting layer and inhibits interdiffusion of the ferromagnetic metal and the semiconductor.

Prototype SID devices have been made with the following specifications. The high mobility heterostructure was grown by molecular beam epitaxy (MBE). See FIG. 2 where the device consists of: (a) a passivation layer 40 made of 3 nm InAs; (b) an insulator layer 45 made of 25 nm $Al_{0.6}Ga_{0.4}Sb$; (c) the 2DEG channel layer 20 made of 15 nm InAs ; (d) an insulator layer 50 made of 200 nm $AlGa_{0.4}Sb$; (e) a buffer layer 55 made of 3 $\mu$m AlSb; and (f) a substrate layer 60 made of semi-insulating GaAs (001). Doping of the InAs layer was achieved by an arsenic soak in the middle of the 25 nm $Al_{0.6}Ga_{0.4}Sb$ barrier. For each prototype, a micron scale channel was fabricated by photolithography and a standard mesa etch, with the InAs layer overetched to promote an undercut (discussed above; refer to FIG. 2). The F layer was then fabricated by photolithography and liftoff. Permalloy was deposited by electron beam evaporation from a single charge of $Ni_{0.8}Fe_{0.2}$, and the film had a thickness of $d_f$=80 nm. The prototypes that showed the best performance were characterized by relatively thin barriers between the 2DEG and the F layer. The photoresist developer and oxygen plasma used to pattern the photoresist for liftoffofF also removed a thickness of about 5 nm from the upper barrier layer.

Figure 3:
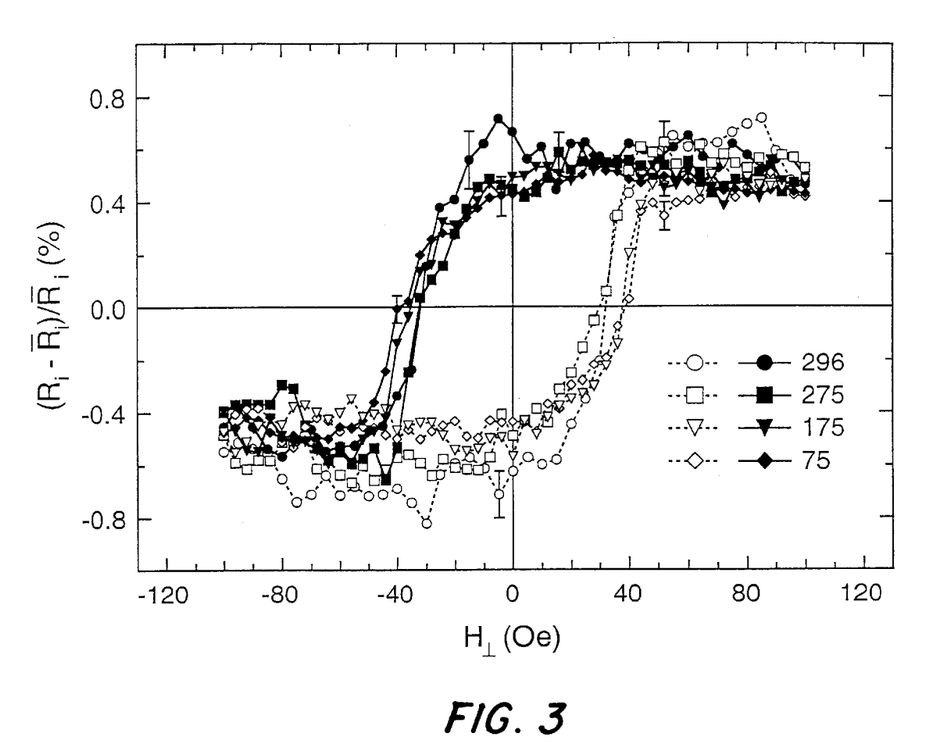
FIG. 3 illustrates the spin dependent diode characteristics by sweeping magnetic field and recording a voltage.

The spin injected diode effect is demonstrated with the data of FIG. 3. The diode characteristic of the device is obtained by sweeping voltage and recording a current. Contributions to the current can arise from electrons tunneling from the 2DEG to F, or from one of several "leakage" sources: thermally generated holes that diffuse across the barrier; electrons that "hop" across locally conductive sites in the barrier; carriers that leak out the edge of the channel into F; or carriers that are conducted through pinhole leaks in the barrier. Leakage currents are not believed to be important because $\Delta R_i/R_i$ is independent of temperature, and leakage currents are minimal at low temperature. We do not intend to be bound by any theory of device operation and we note that the theory of device operation is independent of the microscopic nature of current transport in the diode. For example, this means that the diode could work by tunneling, hopping (sometimes called strong localization), or even Ohmic contact through a small region. The theory is general and does not exclude any of these transport processes.

The data of FIG. 3 result from biasing at constant current and recording V as a function of field along $\hat{y}$; V ($H_y$). The data clearly show a modulation $\Delta V$ of diode voltage as a function of magnetization orientation. External magnetic field is swept along $\pm\hat{y}$. The bistable voltage states correspond to the bistable magnetization states, $\pm M\ \hat{y}$, which change at the coercive field $H_c \approx 40$ Oe. The data show good remanence, equivalently demonstrating a good memory effect with a bistable, nonvolatile state at H=0. The two voltage states differ by approximately $\Delta R/R_i \approx 1\%$, where $R_i$=V/I is the average resistance of the diode. Data were also taken for a single magnetization state and for both polarities of bias current, and current rectification (a different magnitude |V| for the two different bias polarities) was demonstrated.

Prototypes with integrated write wires have not yet been fabricated, but operation of integrated devices (e.g. to perform a storage function in a memory array) would be similar to integrated operation of similar devices. The bistable magnetization states of the single ferromagnetic layer would correspond to binary "1" and "0." The magnetic characteristics of the device can be described by a M(H) hysteresis loop. If that loop is sufficiently square, "half-select" write processes can be performed and a two-dimensional random access memory can be readily fabricated. The data of FIG. 3 demonstrate an appropriately square M(H) loop, and the "half-select" write process is described as follows. Writing a binary state to the layer involves applying a current pulse of appropriate amplitude and duration to an integrated write wire. The current pulse is inductively coupled to the ferromagnetic film F such that fringe magnetic fields from the current pulse are parallel to the plane of F and have sufficient amplitude to orient the magnetization $\vec{M}$. For a given geometry with a particular inductive coupling strength, the amplitude of the write pulse $I_w$ is chosen to be slightly larger than half the switching field $H_s$ of F. A two dimensional array of write wires is fabricated such that one wire from each row and one wire from each column uniquely intersect at any given layer. Write pulses of amplitude $I_w$ applied to a given row and column have sufficient magnetic field to set the magnetization state of a single layer in the array, while other layers along the row and column are not disturbed. See U.S. Pat. No. 5,629,549 to Mark Johnson, the entire contents of which are incorporated herein by reference, which illustrates techniques to read and write.

The read process is similar. The devices can be biased in series along rows, and the output voltages (or currents) can be sensed by columns of wires, each of which leads to a sense amplifier. When the cells in one row are biased, the output voltage (or current) at a given sense amplifier can be compared with a reference value and the binary state of a unique ferromagnetic layer is thereby determined. The diode characteristic of each cell which is the usual current rectification seen in ap-n junction may be designed with sufficient nonlinearity so that each cell is isolated from "crosstalk." Alternatively, other elements (such as independent diodes or FETs) can be incorporated into the cell design to improve isolation.

The advantage of the SID for nonvolatile memory applications is the simplicity of the device. All-metal GMR structures and magnetic tunnel junctions involve components whose electrical properties are difficult to alter, and which therefore have characteristics (such as impedance) that are relatively invariant. These devices also have two ferromagnetic elements which are magnetically coupled. The magnetic characteristic is relatively difficult to engineer reproducibly.

The SID, on the other hand, is made from a semiconducting channel and a single ferromagnetic layer. The impedance of the semiconducting channel can be tuned over a wide range by well-known doping techniques, and the magnetic properties of the single ferromagnetic layer can be engineered with relative simplicity.

Compared with other ferromagnet-semiconductor structures such as a HHE, the output of the HHE is not directly proportional to device impedance. Devices with constant output characteristic may have large impedances as dimensions shrink, and the figure of merit given by the ratio of device output to device impedance may be small. By contrast, the output of the SID is proportional to the device impedance, and a required output level can be attained by tuning the device impedance. Although initial prototypes have shown a figure of merit of about $\Delta R/R_i \approx 1\%$, it is possible that future embodiments can have larger values.

Furthermore, the device can also be operated with the diode output voltage referenced directly to the channel, rather than to the interface resistance of the diode. As depicted in FIG. 1, the current can be biased along the channel (e.g. I+from left to right, I'−) and the voltage can be measured with respect to the channel (e.g. V+from F to V'−). For a given magnitude bias the output voltage $\Delta V$ is the same, but the reference voltage V' may be made small by lithographically reducing the length L. In this way, the figure of merit $\Delta R/R$ can be increased. For most applications, the absolute output level $\Delta V$ is of greatest importance, but there may be environments where a large figure of merit is important.

A further feature of the invention is to provide a magnetoelectronic device appropriate for digital applications, and which is fabricated with a single ferromagnetic film. A particular application is the nonvolatile storage of binary information. The advantage of a device with a single F film, by contrast with approaches that require two or more F layers, is that the magnetic properties of a single layer are more easily controlled. For example, the coercivity and shape of the hysteresis loop are more easily controlled with a single layer. Of greater importance, the margins of reproducibility of the magnetic properties of an ensemble of devices are more easily controlled (and kept to relatively narrow values) for devices with a single F layer than for devices with two or more F layers.

Another feature of the invention is to provide a magnetoelectronic device appropriate for digital applications, and with an intrinsic impedance that can be tuned within a range of convenient values. All-metal devices, such as magnetoresistors, have low impedances and draw high currents (requiring high operating power). Magnetic tunnel junctions (MTJ) have intrinsically high impedances, and have large RC delay times. MTJs can be fabricated with low device impedance, but these devices are not reproducible and have high device noise. For a variety of engineering reasons, devices with impedances of order 1 KΩ to 100 KΩ are desirable. The spin injected diode can be fabricated with impedances of this order.

Another feature of the invention is to provide a magnetoelectronic device appropriate for digital applications, where the single magnetoelectronic device performs a storage function and an isolation function. Other magnetoelectronic devices, such as magnetoresistors and MTJs, suffer from poor device isolation and must be isolated from an array by select transistors or diodes. The I-V characteristic of the spin injected diode made with suitable materials can be used to offer some isolation from an array.

Another feature of the invention is to provide a new magnetoelectronic device composed of two spin injected diodes which are fabricated over a common, gated channel to form a spin injected FET. The SI FET incorporates very high isolation properties with bistable magnetic characteristics, and has the potential of being an ideal nonvolatile storage cell for nonvolatile random access memory.

Although a SI FET is known from U.S. Pat. No. 5,654,566, to Mark Johnson, the device of the preferred embodiment incorporates an Ohmic contact between the ferromagnetic source and drain and the semiconducting channel by use of a high conductance member 212 in FIG. 6B. It would be analogous to having the structure shown in FIG. 4 where under the ferromagnetic source there is an Ohmic contact layer which is in contact with the 2DEG layer.

Figure 4:
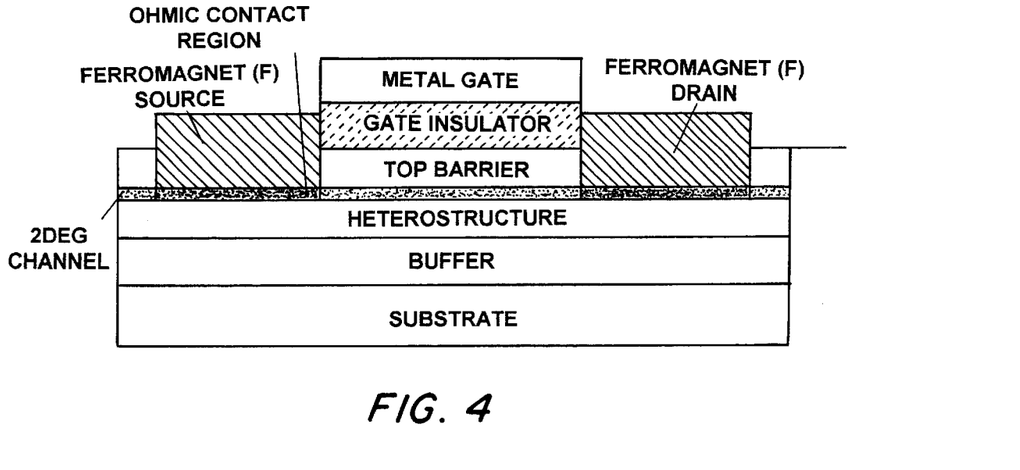
FIG. 4 illustrates a previously disclosed spin injected FET.

The problem with this structure in FIG. 4, where there is a direct Ohmic contact, is that the embodiment has not been demonstrated successfully in a prototype. It is believed that transport through the Ohmic contact region involves a lot of scattering and the spin orientation is randomized. The output of the FET is to have two resistive states or conductive states depending on whether the ferromagnetic layers have parallel or anti-parallel configurations. The $\Delta R$ between these two states is inversely proportional to the randomization and thus for a large randomization exhibited in FIG. 4 there will be a small $\Delta R$ for the output which will be hard to measure and determine.

Figure 5:
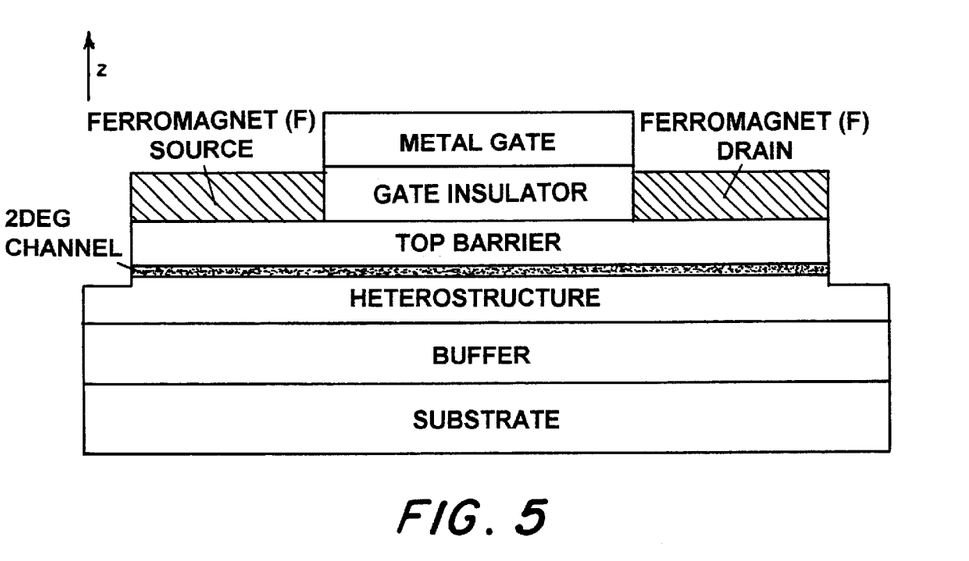
FIG. 5 illustrates a spin injected FET according to the present invention.

A unique feature of the present invention is to have a barrier layer between the 2DEG channel and the ferromagnetic film as illustrated in FIG. 5. This results in an operable device. The transport through the barrier is resistive, but for a different reason than in the direct Ohmic contact in FIG. 4. The transport involves fewer scattering events, with only a single event for a good tunnel barrier, and so there is less spin randomization. Since the $\Delta R$ between these two states is directly proportional to the spin polarization which is inversely proportional to the randomization, then the smaller randomization exhibited in FIG. 5 will result in a larger $\Delta R$ for the output which will be easier to measure and determine.

According to theory, the modulation of the output characteristics of a SI FET should be about 10% for structures fabricated using spin injected diodes and channel lengths of order a ballistic mean free path. Although the present discussion has used III-V heterostructures as a preferred materials system, the device could be fabricated on Si and should be compatible with CMOS processing. The SI FET, with its two SI diodes close together, may work according to theory in Si structures, even if an individual, spin injected diode doesn't work in the sense that it doesn't show spin dependent rectification.

For more information for making the basic structure of the SI FET (but, of course, without the barrier layer between the ferromagnetic layers and the semiconducting layer), see U.S. Pat. No. 5,654,566, to Mark Johnson, the entire contents of which are incorporated herein by reference.

This spin injected FET has two operating stable states determined by the gate voltage, "off" and "on" and these states represent a binary value of a data bit to be stored in the device. The first (e.g. source) and second (e.g. drain) ferromagnetic layers of this FET are both fabricated to be magnetically anisotropic so as to permit the device to have two stable magnetization states, parallel and antiparallel. In the "on" state the spin injected FET has two settable resistance states determined by the relative orientation of the magnetizations of the ferromagnetic source and drain, "HIGH" (antiparallel) and "LOW" (parallel). One of the ferromagnetic films (source) can be fixed with a large magnetic coercivity and polled in one direction and the other ferromagnetic film (drain) has a smaller coercivity. An external magnetic field in the form of a write line can change the magnetization state of the device by orienting the magnetization of the drain to be parallel or antiparallel relative to that of the source. Moreover, when no voltage is applied to the gate the channel has a high electrical impedance and no spin polarized current can flow from the source to the drain. The stored bit of information is thus nonvolatile, and is isolated from the memory array by the high resistance of the channel.

Having described the basic aspects of the invention, the following examples are given to illustrate specific embodiments thereof.

A spin injected diode is made with the following layers as illustrated in FIG. 2. Beginning at the bottom and moving to the top there is a substrate layer made of semi-insulating GaAs (001); a buffer layer made of 3 $\mu$m AlSb; an insulator layer made of 200 nm AlGa$_{0.4}$Sb; a 2DEG channel layer made of 15 nm InAs; an insulator layer made of 25 nm Al$_{0.6}$Ga$_{0.4}$Sb; and a passivation layer made of 3 nm InAs. Doping of the InAs layer was achieved by an arsenic soak in the middle of the 25 nm Al$_{0.6}$Ga$_{0.4}$Sb barrier. A micron scale channel was fabricated by photolithography and a standard mesa etch, with the InAs layer overetched to promote an undercut. The F layer was then fabricated by photolithography and liftoff. Permalloy was deposited by electron beam evaporation from a single charge of Ni$_{0.8}$Fe$_{0.2}$, and the film had a thickness of $d_f$=80 nm.

A magnetic field is applied at 50 gauss either positive or negative. After waiting for a period of time, a 1 milliamp bias current is applied. Since there is a 1 ohm difference as seen in FIG. 3, the difference in voltage output is 1 millivolt. This illustrates the discrimination between the two states.

It is understood that the foregoing detailed description is given merely by way of illustration and that many variations may be made therein without departing from the spirit of this invention.

What is claimed is:

1. A spin injected diode suitable for nonvolatile memory applications comprising
   a semiconducting channel capable of carrying current,
   a single ferromagnetic layer, and
   a barrier layer between the semiconducting channel and the ferromagnetic layer to protect the integrity of the semiconducting channel and to inhibit interdiffusion of the ferromagnetic material and the semiconducting channel,
   wherein said ferromagnetic layer includes an electrical connector for connecting to a readout device, and wherein during diode readout an output modulation being sensed is either
      (a) an interface resistance between the semiconducting channel and the ferromagnetic layer, or
      (b) an output voltage between the semiconducting channel and the ferromagnetic layer when flowing current through the channel and not through the interface.

2. A spin injected diode according to claim 1, wherein the current carried by the semiconducting channel can be either electrons or holes.

3. A spin injected diode according to claim 1, wherein the semiconducting channel has an intrinsic electric field that splits spin states in the semiconducting channel and results in a spin-dependent interface resistance.

4. A spin injected diode according to claim 3, wherein the semiconducting channel has an intrinsic electric field due to the polar nature of the channel material.

5. A spin injected diode according to claim 1, wherein a confining potential of carriers in the semiconducting channel has asymmetry such that there is a large electric field perpendicular to the plane of the carriers.

6. A spin injected diode according to claim 5, wherein the asymmetry in the semiconducting channel is structural or gate-induced.

7. A spin injected diode according to claim 1, wherein the semiconducting channel is a 2DEG layer.

8. A spin injected diode according to claim 1, wherein the thickness of the barrier layer is at least 10 nm.

9. A spin injected diode according to claim 1, wherein the semiconducting channel is a III-V compound.

10. A spin injected diode according to claim 1, wherein the modulation being sensed is the interface resistance between the semiconducting channel and the ferromagnetic layer.

11. A spin injected diode according to claim 1, wherein the magnetization of the single ferromagnetic layer during readout is oriented in either one of two opposite directions.

12. A spin injected diode according to claim 1, wherein the output modulation being sensed is the output voltage between the semiconducting channel and the ferromagnetic layer when flowing current through the channel and not through the interface.

13. A spin injected diode according to claim 1, wherein the impedance of the diode is from about 100 Ω to 10 KΩ.

14. A spin injected diode according to claim 1, wherein the single ferromagnetic layer is a single ferromagnetic film.

15. A memory cell having a spin injected diode suitable for nonvolatile memory applications for storing a data state corresponding to one of a first and a second logical data value, said memory cell comprising:
   a semiconducting channel capable of carrying current,
   a single ferromagnetic layer, and
   a barrier layer between the semiconducting channel and the ferromagnetic layer to protect the integrity of the semiconducting channel and to inhibit interdiffusion of the ferromagnetic layer and the semiconducting channel,
      wherein said memory cell stores the first logical value when the ferromagnetic layer has a magnetic field applied in one direction, and where said memory element stores the second logical value when the magnetic field is applied to the ferromagnetic layer in the opposite direction, and
      wherein said ferromagnetic layer includes an electrical connector for connecting to a readout device, and wherein during diode readout an output modulation being sensed is either
         (a) an interface resistance between the semiconducting channel and the ferromagnetic layer, or
         (b) the output voltage between the semiconducting channel and the ferromagnetic layer when flowing current through the channel and not through the interface.

16. A method of operating a hybrid magnetic spin injected diode device comprising:
   a semiconducting channel capable of carrying current,
   a single ferromagnetic layer, said ferromagnetic layer including an electrical connector for connecting to a readout device; and
   a barrier layer between the semiconducting channel and the ferromagnetic layer to protect the integrity of the semiconducting channel and to inhibit interdiffusion of the ferromagnetic layer and the semiconducting channel, said method comprising:
      applying a magnetic field on the single ferromagnetic layer in either one direction or in the opposite direction to store a first logical value or a second logical value; and
      reading the diode output modulation being sensed by either determining
         (a) an interface resistance between the semiconducting channel and the ferromagnetic layer, or
         (b) the output voltage between the semiconducting channel and the ferromagnetic layer when flowing current through the channel and not through the interface.

17. A magnetic spin injected field effect transistor device comprising:
   a first ferromagnetic layer having a first coercivity;
   a second ferromagnetic layer having a second coercivity smaller than said first coercivity, and spaced apart from said first ferromagnetic layer;
   a gate situated between the first and second ferromagnetic layers and including an insulating layer situated below the gate and between the two ferromagnetic layers;
   a semiconducting channel layer beneath the first and second ferromagnetic layers and beneath the gate that forms a low impedance electrical path between the first and second ferromagnetic layers when a control signal is applied to the gate and a high impedance electrical path between these ferromagnetic layers at all other times; and
   a barrier layer between the semiconducting channel and the first and second ferromagnetic layers to protect the integrity of the semiconducting channel and to inhibit interdiffusion of the first and second ferromagnetic layers and the semiconducting channel.

18. The device of claim 17, wherein the first ferromagnetic layer can be set to a first magnetization orientation, the second ferromagnetic layer can be set to a second magnetization orientation, and an impedance to spin polarized charge carrier current flow in said device is based on the first and second magnetization orientations.

19. The device of claim 18, wherein the impedance to spin polarized electron current flow is relatively low when the first and second magnetization orientations are parallel, and relatively high when the first and second magnetization orientations are anti-parallel.

20. The device of claim 17, wherein both the first and second ferromagnetic layers are magnetically anisotropic.

21. A memory cell having a magnetic spin injected transistor for nonvolatile memory applications for storing a data state corresponding to one of a first and a second logical data value, said memory cell comprising:
   a first ferromagnetic layer having a first coercivity and having a first magnetization orientation;
   a second ferromagnetic layer, spaced apart from said first ferromagnetic layer, having a second coercivity smaller than said first coercivity and having a second alterable magnetization orientation;
   a gate situated between the first and second ferromagnetic layers;
   a semiconducting channel layer beneath the first and second ferromagnetic layers and beneath the gate that forms a low impedance electrical path between the first and second ferromagnetic layers when a control signal is applied to the gate and a high impedance electrical path between these ferromagnetic layers at all other times; and
   a barrier layer between the semiconducting channel and the first and second ferromagnetic layers to protect the integrity of the semiconducting channel and to inhibit interdiffusion of the first and second ferromagnetic layers and the semiconducting channel;
   said gate controlling the electrical conductance of the semiconducting channel layer in response to a cell select signal;

wherein said memory cell stores the first logical value when the first and second magnetization orientations are aligned, and the second logical value when the first and second magnetization orientations are opposite.

22. The device of claim 21, wherein the data state stored in the cell can be read by applying the control signal and measuring a spin polarized current which flows between the ferromagnetic layers in said device, the current in said device being based on the first and second magnetization orientations.

23. The device of claim 22, further including a wire for inductively coupling said second ferromagnetic layer with a magnetic field generated by an input data signal on said wire, the input data signal having one of a first and a second current value corresponding to said first and second logical data values respectively, and whereby the second layer magnetization orientation can be altered by the magnetic field to become one of aligned and opposite to the first layer magnetization.

24. The cell of claim 23, wherein the memory is retained until a different state is written to said cell.

25. The cell of claim 21, wherein the semiconducting channel isolates the memory cell when said cell is not selected by said cell select signal.

26. A method of operating a hybrid magnetic spin injected-field effect transistor device comprising a first ferromagnetic layer having a first coercivity and having a first magnetization orientation;

a second ferromagnetic layer, spaced apart from said first ferromagnetic layer, having a second coercivity smaller than said first coercivity and having a second alterable magnetization orientation;

a gate situated between the first and second ferromagnetic layers;

a semiconducting channel layer beneath the first and second ferromagnetic layers and beneath the gate that forms a low impedance electrical path between the first and second ferromagnetic layers when a control signal is applied to the gate and a high impedance electrical path between these ferromagnetic layers at all other times; and a barrier layer between the semiconducting channel and the first and second ferromagnetic layers to protect the integrity of the semiconducting channel and to inhibit interdiffusion of the first and second ferromagnetic layers and the semiconducting channel;

said gate controlling the electrical conductance of the semiconducting channel layer in response to a cell select signal;

said method comprising:

providing a current of spin polarized charge carriers to flow from said first ferromagnetic layer to said second ferromagnetic layer;

controlling the flow of spin polarized charge carriers between the two layers by applying said control signal to said gate of the field effect transistor having a channel interposed between the two layers; and controlling the quantity of spin polarized current flowing in the device by aligning a second magnetization orientation state of the second ferromagnetic layer relative to a first magnetization orientation state of the first ferromagnetic layer;

whereby when said control signal is applied to said gate, the amount of spin polarized current which flows between the ferromagnetic layers in said device is based on the first and second magnetization orientations.

27. The method of claim 26, wherein aligning of the second magnetization orientation state of the second ferromagnetic layer relative to the first magnetization orientation state of the first ferromagnetic layer can be changed by inductively coupling the second ferromagnetic layer with a write line generating a magnetic field.

28. The method of claim 27, wherein the magnetic field from the write line can set the second magnetization orientation to either of two stable non-volatile states, and these states represent a binary value of a data bit to be stored in the device.

29. The method of claim 28, further including a step of reading the data bit stored in the device by applying said control signal to said gate, and comparing an output signal generated by the spin polarized current with a reference value to determine the data bit stored in said device.

30. The method of claim 27, wherein the magnetic field from the write line can set the second magnetization orientation to either of two stable non-volatile states, and these states represent a boolean function binary data value relating one or more input logic signals, and wherein the second magnetization orientation stores the boolean function binary data value and only changes in response to certain predetermined combinations of the input logic signals.

* * * * *